United States Patent

Baiocchi et al.

(10) Patent No.: US 7,291,849 B1
(45) Date of Patent: Nov. 6, 2007

(54) CALIBRATION STANDARD FOR TRANSMISSION ELECTRON MICROSCOPY

(75) Inventors: Frank A. Baiocchi, Allentown, PA (US); John Michael DeLucca, Wayne, PA (US); James Thomas Cargo, Bethlehem, PA (US)

(73) Assignee: Agere Systems Inc., Allentown, PA (US)

( * ) Notice: Subject to any disclaimer, the term of this patent is extended or adjusted under 35 U.S.C. 154(b) by 46 days.

(21) Appl. No.: 11/237,410

(22) Filed: Sep. 28, 2005

(51) Int. Cl.
*G12B 13/00* (2006.01)
*H01L 21/66* (2006.01)

(52) U.S. Cl. .............. 250/491.1; 250/252.1; 250/306; 250/307; 250/310; 250/311

(58) Field of Classification Search .............. 250/491.1
See application file for complete search history.

(56) References Cited

U.S. PATENT DOCUMENTS

| | | | |
|---|---|---|---|
| 4,837,174 A * | 6/1989 | Peterson | 438/526 |
| 4,862,197 A * | 8/1989 | Stoffel | 347/59 |
| 6,410,927 B1 * | 6/2002 | Pike | 250/491.1 |
| 6,477,225 B1 * | 11/2002 | Morales et al. | 378/35 |
| 6,559,456 B1 * | 5/2003 | Muraki | 250/491.1 |
| 6,627,903 B1 * | 9/2003 | Hirayanagi | 250/491.1 |
| 6,750,447 B2 | 6/2004 | Houge et al. | |
| 6,830,943 B1 | 12/2004 | Lo et al. | |
| 6,864,488 B2 * | 3/2005 | Muraki | 250/442.11 |
| 6,875,982 B2 | 4/2005 | Bedell et al. | |
| 6,897,440 B1 * | 5/2005 | Yamada | 250/306 |
| 6,967,327 B2 * | 11/2005 | Yamada | 250/307 |
| 6,982,418 B2 * | 1/2006 | Yamada | 250/306 |

OTHER PUBLICATIONS

MAG*I*CAL TEM Calibration Specimen, and Sample, from http://www.2spi.com/catalog/standards/magical.shtml, Jul. 27, 2005 (6 pages).

* cited by examiner

*Primary Examiner*—Nikita Wells
*Assistant Examiner*—Bernard Souw

(57) ABSTRACT

A calibration standard includes a silicon substrate having a plurality of defined regions and a plurality of calibration marks placed on respective defined regions of the silicon substrate. Each calibration mark comprises a different calibration dimension indicator and a corresponding dimension identifier. A method for calibrating a transmission electron microscope using the standard comprises positioning the calibration standard in a viewing area of the transmission electron microscope and sequentially viewing the marks and adjusting the calibration of the microscope for each mark viewed.

12 Claims, 4 Drawing Sheets

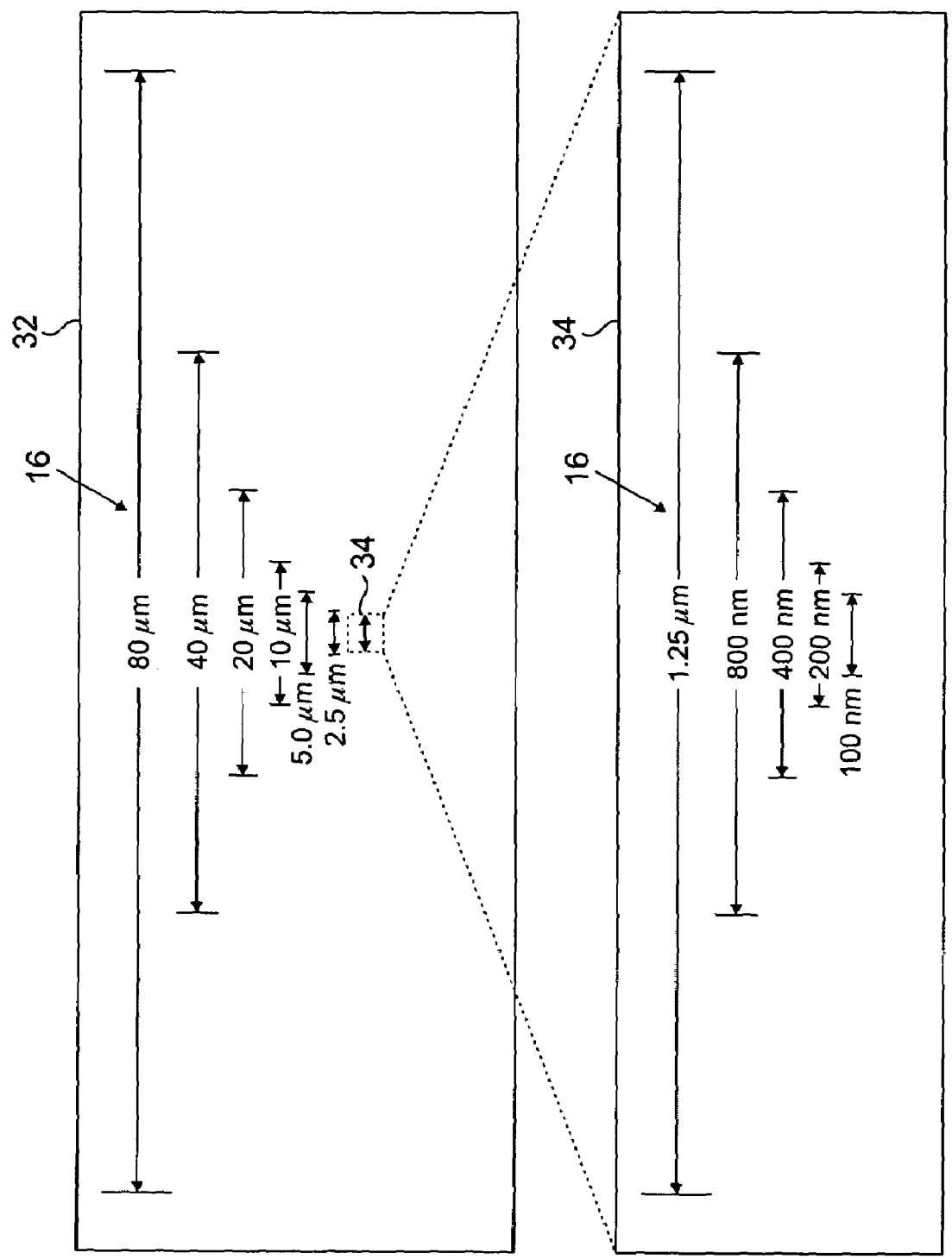

CALIBRATION STANDARD FOR TRANSMISSION ELECTRON MICROSCOPY

FIELD OF THE INVENTION

This invention relates in general to the field of instrument calibration. More particularly, this invention relates to a calibration standard for Transmission Electron Microscopes (TEM).

BACKGROUND OF THE INVENTION

Semiconductor manufacturing consists of a number of crucial processing steps performed on wafer lots where measurements of minimum feature sizes known as critical dimensions (CD) are made to ensure proper device fabrication. The high-degree of precision during this processing requires the utilization of Scanning Transmission Electron Microscopes and Transmission Electron Microscopes (S/TEM) to calibrate in line CD-SEM instruments. These critical tools provide measurement capabilities in the low nanometer range. Accuracy of their measurements is essential since effective process controls depend on CDs they supply. S/TEMs require frequent calibration to ensure their accuracy since processing errors cause appreciable variation in CDs. Calibration procedures are very time consuming and have a negative impact on semiconductor fabrication workflow. Typical S/TEM magnification calibration approaches are also limited in accuracy.

A conventional calibration approach utilizes a standard that possesses a crystal lattice specimen to calibrate a S/TEM for a particular relatively high magnification. Measurements obtained from the specimen's crystal lattice spacing are compared to known data to determine if the S/TEM requires adjustment, or if the magnification results being calibrated are within tolerance. Calibration adjustments are then made accordingly. This approach requires that calibration for other magnifications in the range of magnifications, such as relatively lower magnifications, required to support semiconductor fabrication use different standards. Thus, multiple specimen exchanges along with new orientations to achieve calibration over a range of magnifications are required. In addition, the beam conditions must be reset for each standard. This iterative process is conducted until calibration is achieved for the full range of magnification required in support of semiconductor fabrication.

Another technique uses a calibration standard that includes one or two repeating features that are calibrated to a single dimensional value, such as a series of parallel lines spaced apart at a predetermined, calibrated distance. Such a standard is only useful over a certain portion of the usable magnification range of an S/TEM, thereby again requiring several different standards having appropriately varying sized features to allow the S/TEM to be calibrated over its useable range. Because S/TEM's are typically operating in a high vacuum environment, the vacuum must be broken and re-established each time a standard is changed for a different range of calibrations, resulting in an undesirable time delay. Furthermore, the use of repeating features such as uniformly spaced apart lines requires an operator calibrating the instrument to manually count the number of repeating features and cross reference the known feature dimensional values to arrive at a distance for the features to be used in calibrating the instrument. Accordingly, an operator may need to count as many as 50 repeating features, look up the dimensional value, and then multiply the number of features by the dimensional value to calculate a size measurement for calibration. This process may need to be repeated for multiple magnification values, typically 15 or more magnification values, using several different standards to cover the magnification range of the S/TEM. Such a process is time consuming and error prone.

BRIEF DESCRIPTION OF THE DRAWINGS

The features of the invention believed to be novel are specifically set forth in the appended claims. However, the invention itself, both as to its structure and method of operation, may best be understood by referring to the following description and accompanying drawings.

FIG. 3 is magnified representation of a portion of the exemplary calibration standard shown in FIG. 2.

FIG. 4 is magnified representation of a portion of the portion of the exemplary calibration standard shown in FIG. 3.

DETAILED DESCRIPTION OF THE INVENTION

Figure 1:
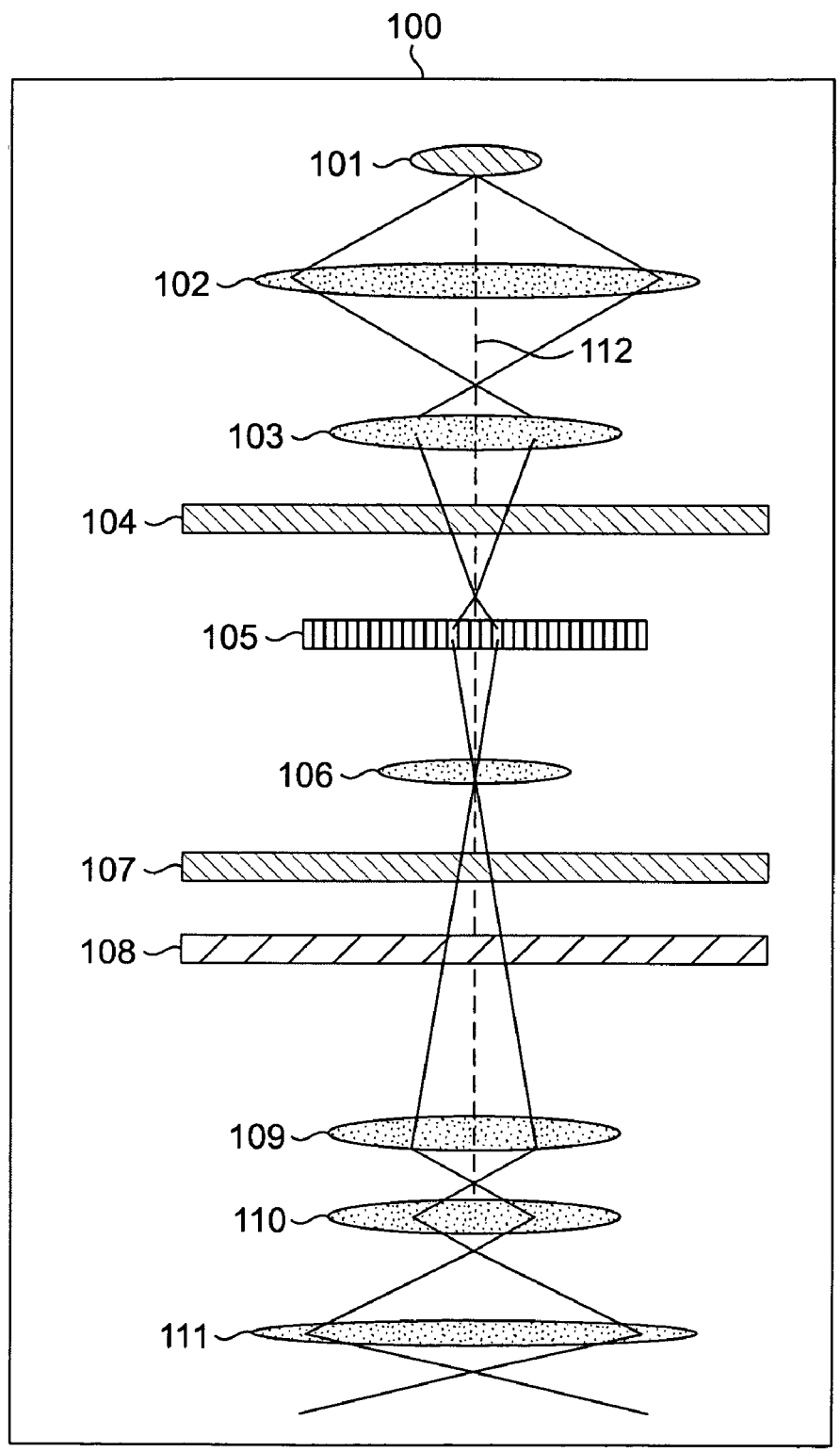
FIG. 1 is a diagram representing a prior art S/TEM system.

During fabrication, semiconductor products are analyzed using high-resolution electron microscopy such as Scanning Transmission Electron Microscopes (STEM) and Transmission Electron Microscopes (TEM), sometimes referred to collectively as S/TEM system. A block diagram representing a S/TEM system 100 is provided in FIG. 1 where the energy source represents an electron gun 101 that produces a stream of monochromatic electrons. This stream is focused into a small, thin, coherent beam by the use of condenser lenses 102, 103. The first lens 102 largely determines the "spot size"; the general size range of the final spot that strikes a sample 105. A "spot size knob" usually controls this condenser lens. The second condenser lens 103 changes the spot size on a sample also known as a specimen 105, adjusting the beam from a dispersed spot to a pinpoint beam. An "intensity or brightness knob" controls this lens. The user selected condenser aperture 104 constricts the resulting beam. This condenser aperture 104 blocks high angle electrons, those far from the optic axis (i.e., the dotted line 112 down the center). The beam strikes a sample 105 and parts of it are transmitted through the sample. The transmitted portion is focused by the objective lens 106 into an image. The optional objective lens 107 and selected area 108 apertures can restrict the beam. The objective aperture 107 enhances contrast by blocking out high-angle diffracted electrons. The selected area aperture 108 enables a user to examine the periodic diffraction of electrons by ordered arrangements of atoms in the sample. The resulting image is enlarged as it passes through the intermediate lenses 109, 110 and projector 111 lens. This image strikes the phosphor image screen and light is generated, resulting in an image for the user to see. The darker areas of an image represent areas of the sample that fewer electrons were transmitted through (they are thicker or denser). The lighter areas of the image represent those areas of the sample that more electrons were transmitted through (they are thinner or less dense). Semiconductor fabrication routinely requires S/TEM magnification ranging from 10,000 to 5 million times (×). Accuracy of S/TEM results at these magnification levels is critical to fabrication processing. Therefore, routine periodic S/TEM calibration must be performed.

S/TEMs can be calibrated by measuring known feature dimensions of calibration standards. S/TEM calibration is typically an iterative process performed at various magnification powers of the S/TEM. A calibration standard having features of known dimensions is placed under the beam and a desired calibration magnification is set. In a typical method of calibration, a magnified feature having a known dimension is identified, the magnified feature is measured, and then this measurement is compared to the known dimension in order to calculate the actual magnification and calibrate the instrument at the magnification setting. This method may be performed for other magnification levels, which may require use of a different standard. Each time a sample is exchanged, S/TEM operational conditions and orientation must be reset, in an iterative and very time consuming process. Once calibration is achieved for the complete magnification range required, the calibration procedure is considered complete. This process has a significant negative impact on fabrication cycle time (i.e., the S/TEM is not available for fabrication support while being calibrated).

While S/TEM calibration standards having multiple dimensioned features have been proposed, the inventors have realized that these standards still require counting of repetitive features, cross referencing of dimensional values of the features, and multiplication steps to calculate size measurements for calibration. In addition, such standards may still have limited magnifications ranges, especially at very low magnifications, such as in the range of about 100× to 1000×, because the features used are too small for these magnification ranges. Furthermore, such standards are sometimes produced using costly techniques such as molecular beam epitaxy and ion milling. Accordingly, the inventors have developed a calibration standard that includes labeled, multiple sized features on a single crystalline silicon sample that may be fabricated using standard silicon semiconductor processing techniques.

Figure 2:
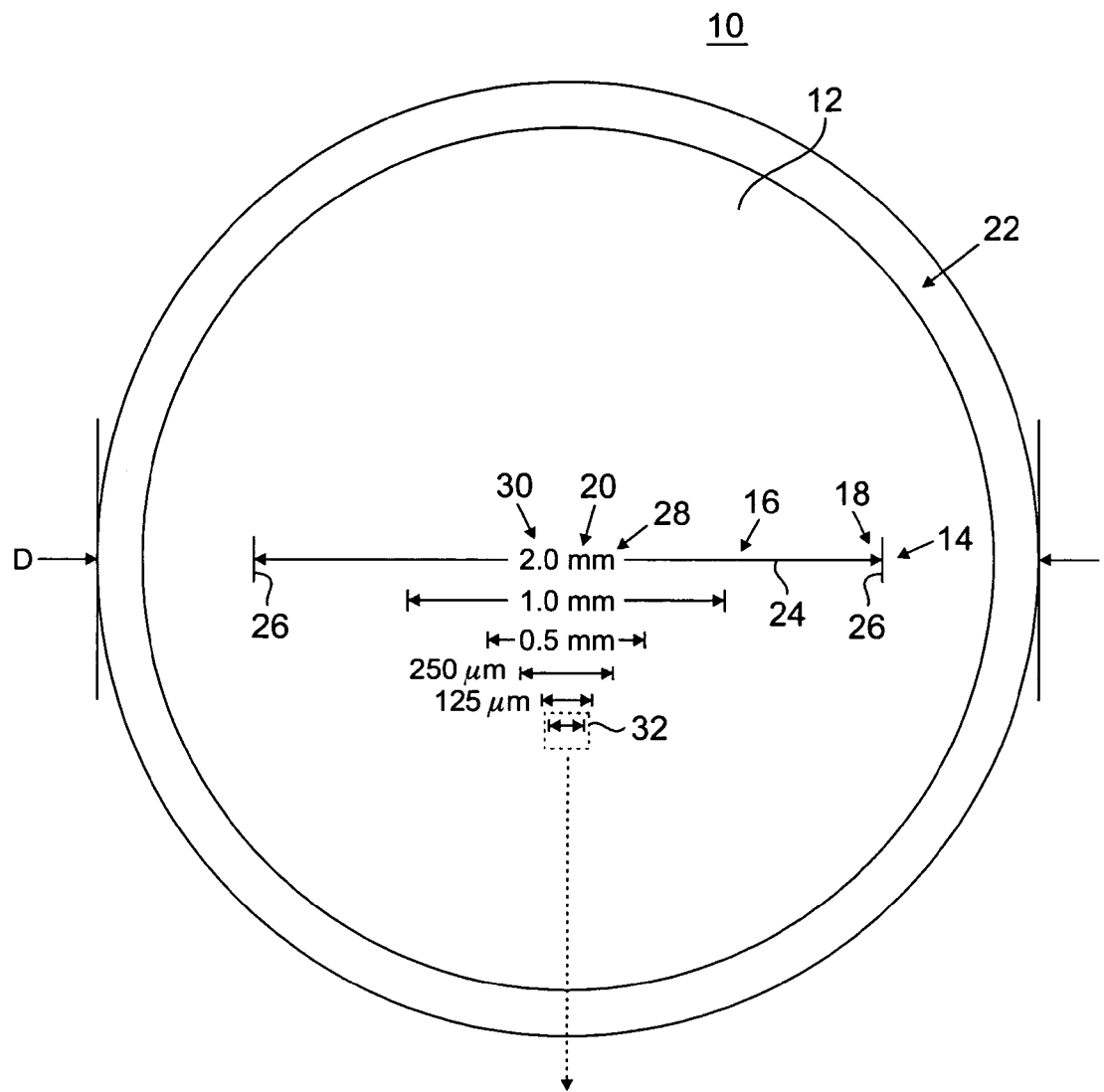
FIG. 2 is top view of an exemplary calibration standard for calibrating an S/TEM.

FIG. 2 is top view of an exemplary calibration standard 10 for calibrating an S/TEM. The calibration standard 10 includes a silicon substrate 12 having a plurality of defined regions 14, 15. Each region 14, 15 includes a calibration mark 16 having a different calibration dimension indicator 18 and a dimension identifier 20 indicative of the respective calibration dimension. In an aspect of the invention, the dimension indicator 20 may include a horizontal line 24 with arrows between vertical bars 26 spaced apart a predetermined distance. The dimension identifier 20 may include an arbitrary letter or other designator to be defined in a separate calibration certificate or may include a number 30 and units 28 corresponding to the distance indicated by the dimension indicator 18. The standard may further include a support 22, such as a ring or grid, for supporting the substrate 12. The support may have a diameter, D, of 3.05 millimeter to fit standard TEM specimen holders.

In an embodiment of the invention, the substrate 12 may be formed from an undoped or lightly doped, thin, single crystal silicon (Si) layer that allows transmission of the S/TEM beam therethrough. For example, the silicon substrate 12 include a silicon wafer ground sufficiently thin, such as less than about 1500 Angstroms, and preferably less than about 1000 Angstroms, to allow transmission of the electron beam and allow imaging of the atomic lattice of the silicon substrate 12 at relatively high magnifications. The substrate may be oriented to the silicon [1 1 0] pole in order to allow imaging of the silicon (1 1 1) planes. In another embodiment, the substrate 12 may be an epilayer.

The calibration marks 16 may be formed using standard semiconductor processing techniques, such as are used in silicon device or mask fabrication. For example, a material, such as tungsten silicide or other suitable metal or silicide, may be deposited onto the substrate 12 and then patterned and etched to produce the marks 16, such as the dimension indicator 18 and the dimension identifier 20, in the corresponding regions, such as regions 14, 15. A material such as tungsten suicide may be used in part due to its availability in semiconductor processing, as well as for the relatively high level of contrast this material produces in comparison with the silicon substrate on which it is formed. FIG. 3 is magnified representation of a portion 32 of the exemplary calibration standard 10 shown in FIG. 2, while FIG. 4 is magnified representation of a portion 34 of the portion 32 of the exemplary calibration standard 10 shown in FIG. 3. These figures show different marks available in different regions of the calibration standard as magnification of the substrate 12 is increased.

Figure 5:
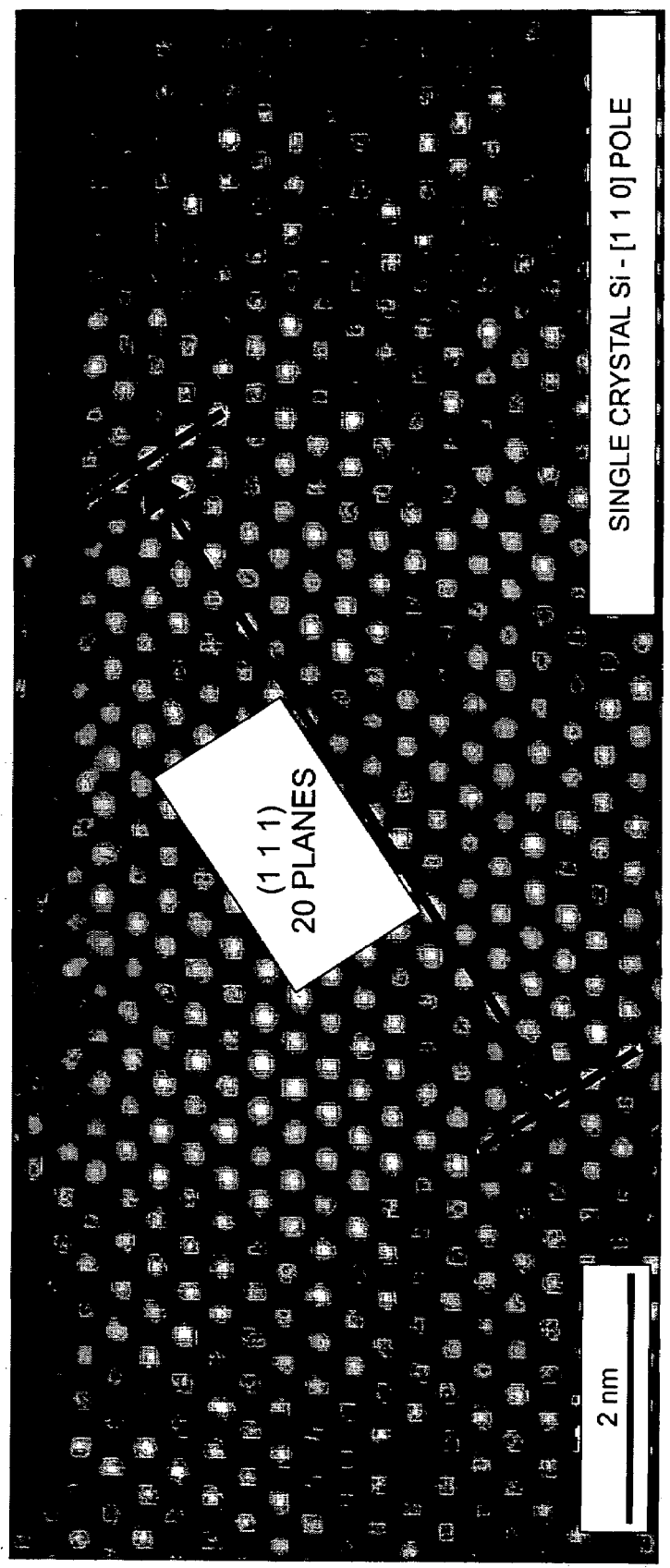
FIG. 5 is an image of a magnified portion of the exemplary calibration standard shown in FIG. 2.

For a dimensional range of 200 nanometers and below, other forms of dimension indicators may be used on the standard. For example, nanoparticles of known size may be applied to certain regions to provide an additional calibration feature for the dimensional range between 200 nm and a silicon lattice plane spacing. The spacing of the silicon lattice planes may be used at higher magnifications as calibration indicia. FIG. 5 shows an image of a magnified portion of the exemplary calibration standard 10 comprising single crystal Si [1 1 0] shown in FIG. 2. The (1 1 1) planes are visible and can be used as calibration indicia because the distance between the planes (3.138 Angstroms) is known.

This invention establishes S/TEM calibration that can be performed accurately and quickly over the range of magnifications of the S/TEM, without the necessity of iterative standard exchanges and multiple sample/beam alignments. By only requiring a single calibration standard for all magnification levels, standard exchange and vacuum breaking need only be performed once. Advantageously, the invention provides calibration marks 16 having dimension identifiers 20, that allow a calibration dimension value to be read in-situ during the calibration process. A user performing a calibration can use a single mark 16 at a given magnification as a calibration standard measurement as opposed to having to count multiple repeating indicia to arrive at a calibration dimension. Indicia, such as nanoparticles having a know size, may be used for calibrating dimensions, for example, less than about 200 nanometers. In addition, the standard provides for calibrating dimensions at the atomic resolution level using, for example, Si (1 1 1) lattice planes. Further, because the substrate material is single crystal silicon, the proposed standard would also allow for camera constant calibration in diffraction mode.

By focusing from region 14 to region 15 on the standard 10 and adjusting the magnification accordingly, various calibration dimensions can be observed and read at the appropriate magnifications. This ensures beam conditions remain the same from region to region and eliminates sample and beam alignment between samples. Viewing a sample can be accomplished by moving the electron beam or by moving the sample. Since the calibration dimensions can be read directly, the operator can move rapidly between calibration features to make the necessary calibration adjustments and the calibration is then complete. The ease and speed of this calibration method affects not only the throughput of the S/TEM, but the frequency with which tests can be reasonably conducted. This process also speeds up turnaround time of samples for critical dimension measurements on features too small to be measured accurately in the clean room and for checks on in-line tools.

While the preferred embodiments of the present invention have been shown and described herein in the present context, such embodiments are provided by way of example only, and not of limitation. Numerous variations, changes and substitutions will occur to those skilled in the art without departing from the invention herein. For example, the present invention need not be limited to best mode disclosed herein, since other applications can equally benefit from the teachings of the present invention. Accordingly, it is intended that the invention be limited only by the spirit and scope of the appended claims.

What is claimed is:

1. A method for calibrating a transmission electron microscope comprising:
    providing a calibration standard having a plurality of calibration entities said entities comprising 1) a silicon epilayer, and 2) a plurality of calibration marks positioned overlying said silicon epilayer on respective defined regions of the standard, each mark comprising a different calibration dimension indicator and a corresponding dimension identifier wherein said dimension indicator comprises a metal or silicide patterned structure having a lateral dimension employable for said calibrating;
    positioning the calibration standard in a viewing area of the transmission electron microscope; and
    sequentially viewing a plurality of the entities and adjusting the calibration of the microscope for each entity.

2. The method of claim 1, wherein the step of sequentially viewing includes the step of focusing the transmission electron microscope.

3. The method of claim 1, wherein the step of sequentially viewing includes the step of translating the standard to position selected marks within a viewing range of the microscope.

4. The method of claim 1, wherein the step of sequentially viewing includes the step of electronically directing an electron beam of the microscope onto selected calibration marks.

5. A calibration standard comprising:
    a silicon substrate including a silicon epilayer adapted to be viewed in a transmission electron microscope, said substrate having a plurality of defined regions; and
    a plurality of calibration marks being placed on respective defined regions of the silicon substrate, each mark comprising a different calibration dimension indicator comprising 1) a metal or silicide patterned structure having a lateral dimension employable for calibration and 2) a corresponding dimension identifier.

6. The calibration standard of claim 5, further comprising a support structure attached to the substrate.

7. The calibration standard of claim 5, wherein the silicon comprises a single crystal silicon oriented to a predetermined pole to allow viewing one or more silicon planes.

8. The calibration standard of claim 7, wherein the predetermined pole is a [1 1 0] pole.

9. The calibration standard of claim 5, wherein the silicon comprises a single crystal silicon layer sufficiently thin to allow transmission of a transmission electron microscope beam.

10. The calibration standard of claim 9 wherein the silicon layer is less than about 1500 angstroms thick.

11. The calibration standard of claim 9 wherein the silicon layer is less than about 1000 angstroms thick.

12. The calibration standard of claim 5, wherein the marks comprise tungsten silicide.

* * * * *